(12) United States Patent  
Kitahori et al.

(10) Patent No.: US 7,545,598 B2  
(45) Date of Patent: Jun. 9, 2009

(54) FPC-CONNECTOR CONNECTING STRUCTURE AND MAGNETIC DISK

(75) Inventors: Hiroki Kitahori, Kanagawa (JP); Shinichi Kimura, Kanagawa (JP); Akira Morita, Kanagawa (JP)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 415 days.

(21) Appl. No.: 11/317,808

(22) Filed: Dec. 22, 2005

(65) Prior Publication Data

US 2006/0141816 A1 Jun. 29, 2006

(30) Foreign Application Priority Data

Dec. 27, 2004 (JP) .............................. 2004-376202

(51) Int. Cl.  
*G11B 33/12* (2006.01)

(52) U.S. Cl. .................................................. 360/97.01

(58) Field of Classification Search ............. 360/97.01, 360/97.02, 97.03, 97.04, 98.01, 99.08, 99.12  
See application file for complete search history.

(56) References Cited

U.S. PATENT DOCUMENTS

| | | | | |
|---|---|---|---|---|
| 5,646,801 A | * | 7/1997 | Boigenzahn et al. | ..... 360/97.01 |
| 5,751,514 A | * | 5/1998 | Hyde et al. | ............... 360/97.01 |
| 5,898,537 A | * | 4/1999 | Oizumi et al. | ........... 360/97.01 |
| 6,168,459 B1 | * | 1/2001 | Cox et al. | .................... 439/495 |
| 6,310,747 B1 | * | 10/2001 | Emo et al. | ............... 360/97.02 |
| 7,070,421 B2 | * | 7/2006 | Nozaki et al. | .................. 439/67 |

FOREIGN PATENT DOCUMENTS

JP 2000-188487 7/2000

* cited by examiner

*Primary Examiner*—Jefferson Evans  
(74) *Attorney, Agent, or Firm*—Townsend and Townsend and Crew LLP; John Henkhaus (57) ABSTRACT

Embodiments of the invention provide an FPC connecting structure superior in positioning in a magnetic disk drive. According to one embodiment, in an FPC-connector connecting structure in a magnetic disk drive, edge portions rise from the bottom of a base and there are formed inner surfaces of the edge portions. An FPC connected to a spindle motor and drawn out from an FPC draw-out port has an FPC terminal portion formed at an extreme end thereof. The FPC terminal portion comes into contact with the inner surfaces and is positioned thereby. A guide pin is also used for the positioning. Positioning of the FPC terminal portion may be done easily and positively by utilizing a corner of the base.

20 Claims, 8 Drawing Sheets

FPC-CONNECTOR CONNECTING STRUCTURE AND MAGNETIC DISK

CROSS-REFERENCES TO RELATED APPLICATIONS

This application claims priority from Japanese Patent Application No. JP2004-376202, filed Dec. 27, 2004, the entire disclosure of which is incorporated herein by reference.

BACKGROUND OF THE INVENTION

The present invention relates to a connecting structure capable of accurately positioning an FPC terminal portion of a flexible printed circuit board mounted to a magnetic disk drive and a connector and being applicable to a base of a new structure.

A magnetic disk drive, which uses a base formed by pressing a steel plate, is provided with a flange for a sealing tape affixing surface on an edge of a base heretofore. The flange is formed substantially in parallel with the bottom of the base. A base cover is mounted over an upper surface of the base so as to be positioned inside the edge of the flange and thereafter the base cover and the flange are sealed using a sealing tape. Recently, in the course of pursuing a further reduction in size of the magnetic disk drive, a new enclosure structure has been proposed wherein the flange is removed for size reduction in the horizontal direction of the base and sealing tape affixing faces are formed sideways of the base.

Figure 7:
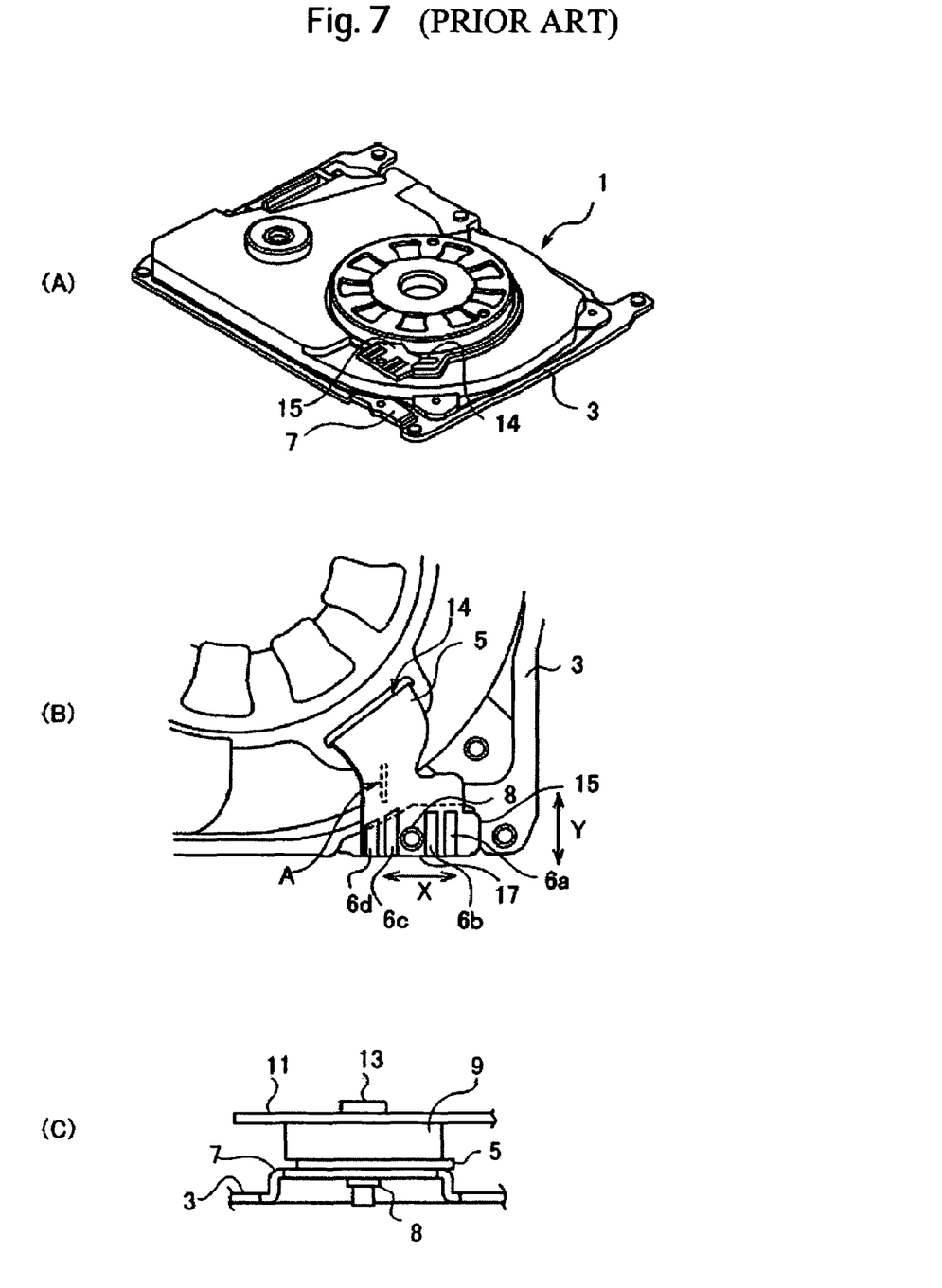
FIGS. 7A-7C are diagrams explaining an FPC-connector connecting structure in a conventional base.

FIGS. 7(A) to 7(C) illustrate a connecting structure of a flexible printed circuit board (hereinafter referred to as "FPC") and a connector adopted in a conventional base 1 provided with a flange. FIG. 7(A) shows a bottom of the base 1 as seen from the outside or underside. A flange 3 is formed on an edge of the base 1. An FPC 5 is drawn out from an FPC draw-out port 14 formed in the base 1, and is connected to a spindle motor in the interior of the base 1. An FPC terminal portion 15 is formed at an extreme end of the FPC 5. The FPC terminal portion 15 is fixed temporarily to a terminal fixing portion 7 formed on the base 1 using a double-coated adhesive tape.

FIG. 7(B) is a plan view showing the temporarily fixed portion of FPC 5 on a larger scale. FIG. 7(C) is a side view showing a portion wherein a connector 9 is connected to the FPC 5. The terminal fixing portion 7 projects to a circuit board 11 side from the surface of the flange portion 3 so as to be suitable for connection with the connector 9 secured to the circuit board 11. A boss 8 projecting inside the base (the side opposite to the circuit board) is formed on the terminal fixing portion 7 by burring and the inside thereof is tapped for threaded insertion therein of a screw 13. In forming the boss 8, it has so far been taken into account that a tapping length should be ensured and that a plane for fixing the FPC terminal portion 15 cannot be ensured in the terminal fixing portion 7 if the boss 8 is projected to the terminal fixing portion 7 side. Moreover, a conclusive evidence that the boss 8 is positively utilized in positioning the FPC terminal portion 15 has not been obtained. For these reasons the boss has been projected inside the base.

The FPC draw-out port 14 is formed in the bottom of the base 1 as an elongated opening in conformity with the shape of FPC 5. In the structure for connecting FPC to the spindle motor, the FPC draw-out port 14 is disposed as in FIG. 7(B) with respect to a corner of the base 1. The FPC terminal portion 15 are formed with four terminal pads 6a, 6b, 6c and 6d which are connected to connector pins of the connector 9. The back side of the FPC terminal portion 15 is fixed to the terminal fixing portion 7 with use of a double-coated adhesive tape. Front end portions of the terminal pads 6a, 6b, 6c and 6d are later subjected to an insulating process because portions which have been used as electrodes in gold plating are exposed. In this case, to effect positioning of the connector 9 pre-fixed to the circuit board 11 and the FPC terminal portion 15, the edge 17 of the FPC terminal portion 15 is aligned with a boundary between the terminal fixing portion 7 and the flange 3 and also with an edge of the terminal fixing portion 7, followed by affixing with a double-coated adhesive tape. The positioning work has required skill because there has been no guide for positioning the FPC terminal portion 15 accurately relative to the base.

Since the longitudinal direction of the FPC draw-out port 14 and that of the terminal fixing portion 7 do not become parallel to each other due to the layout of the FPC draw-out port 14, the shape of the FPC 5 is improved so that the FPC terminal portion 15 is received within the terminal fixing portion 7. However, there is a difference in height between the FPC draw-out port 14 and the surface of the terminal fixing portion 7. Also, there is a slight error in the fixing position in the work of temporarily fixing the FPC terminal portion 15 to the terminal fixing portion 7. As a result, a deflection occurs in position A of the FPC 5. A restoring force of the deflection overcomes the adhesive force of the double-coated adhesive tape and causes a positional deviation of the FPC 5 in X or Y direction prior to fixing the connector 9 and the FPC 5 completely with a screw.

Moreover, the new base structure described above, in which a sealing tape is affixed to side faces of the base, requires that the side face of the base be utilized as a sealing tape affixing face. Thus, it is impossible to adopt such a conventional FPC terminal-connector connecting structure as forming a terminal fixing portion which utilizes the edge portion of the base. Therefore, it has been necessary to improve the connecting structure. Further, in adopting a new connecting structure, it has been necessary to solve the problem of alignment involved in the conventional connecting structure.

Patent Literature 1 (Japanese Patent Laid Open No. 2000-188487) describes an FPC cable whose shape is improved so that the connection of connector can be done within a narrow space and in a deflection-free state. For the connector connection disclosed in Patent Literature 1, an end portion of FPC cable matches an edge of a base.

BRIEF SUMMARY OF THE INVENTION

The present invention provides an FPC-connector connecting structure which may effect easy and accurate positioning relative to a base in a magnetic disk drive. The present invention provides an FPC-connector connecting structure which may be adopted in the case of using side faces of a base in a magnetic disk drive as sealing tape affixing faces. The present invention provides a highly reliable FPC-connector connecting structure in a magnetic disk drive. The present invention also provides a magnetic disk drive adopting such a connecting structure.

The principle of the present invention resides in that inner surfaces of two edge portions present at a corner of a base are utilized as guide surfaces in order to position an FPC terminal portion formed in FPC with respect to a base of a magnetic disk drive. The FPC terminal portion is formed with two mating portions for contact with the guide surfaces to effect positioning, whereby it is possible to effect positioning relative to the base easily and accurately.

In a first aspect of the present invention there is provided a connecting structure for connection of a flexible printed circuit board (FPC) and a connector in a magnetic disk drive, comprising a base, the base including a bottom, a first edge portion rising from the bottom, and a second edge portion adjacent at a corner to the first edge portion and rising from the bottom, and an FPC terminal portion formed on the FPC and including a first mating portion and a second mating portion, wherein the FPC terminal portion is disposed in a terminal fixing portion in a state in which the first mating portion is in contact with an inner surface of the first edge portion and the second mating portion is in contact with an inner surface of the second edge portion.

The first and second edge portions of the base are adjacent to each other at a corner, and the first and second mating portions provided in the FPC terminal portion are disposed in the terminal fixing portion in a state in which they are in contact with inner surfaces of the first and second edge portions of the base. Therefore, the FPC terminal portion may be positioned relative to the base easily and accurately. Moreover, since the FPC terminal portion is disposed in the terminal fixing portion in a contacted state with inner surfaces of the base edge portions, it is not an obstacle to maintaining the base edge portions throughout the whole circumference. Thus, it becomes possible to utilize outer surfaces of the base edge portions as sealing tape affixing surfaces.

By providing a guide pin on the surface of the terminal fixing portion and forming in the FPC terminal portion a through hole for passing through of the guide pin, it is possible to effect positioning of the FPC terminal portion in its slide direction by utilizing the guide pin. In the case where the base is formed using a steel plate, the guide pin may be formed with high accuracy by burring. If the inside of the guide pin is tapped, it may be utilized for tightening a screw which is for mounting the guide pin to the connector.

If the FPC terminal portion is affixed to the terminal fixing portion with use of a double-coated adhesive tape, the connection of the connector to the FPC terminal portion and the temporary fixing prior to permanent fixing with a screw may be done easily. Moreover, in the case of a double-coated adhesive tape, a fixing position error may be corrected easily. Even when a terminal pad is exposed from the extreme end of the FPC terminal portion due to gold plating, any special insulating treatment for the prevention of short-circuit is needed for the extreme end of the FPC terminal portion because a corner space is ensured between the extreme end of the FPC terminal portion and the inner surface of the base edge portion.

If a line perpendicular to a longitudinal edge of a draw-out port for the FPC and extending through a middle point of the longitudinal edge passes through a corner formed by both first and second edge portions, it is possible to effect FPC wiring so as not to bend relative to the terminal fixing portion. Thus, there is no fear that the FPC may be deflected halfway. By adopting such a connecting structure, the outer surfaces of the first and second edge portions may be utilized as sealing tape affixing surfaces, whereby the conventional flange may be eliminated and it is possible to provide a small-sized magnetic disk drive.

In a second aspect of the present invention there is provided a magnetic disk drive comprising a base, the base including a bottom, a first edge portion rising from the base, and a second edge portion adjacent at a corner to the first edge portion and rising from the bottom, a base cover matching the base, a spindle motor mounted to the base, and a flexible printed circuit board (FPC) connected at one end thereof to the spindle motor and provided at an opposite end thereof with an FPC terminal portion, the FPC terminal portion including a first mating portion and a second mating portion and being disposed in a terminal fixing portion in a state in which the first mating portion is in contact with an inner surface of the first edge portion and the second mating portion is in contact with an inner surface of the second edge portion.

A circuit board with a connector attached thereto is mounted in the magnetic disk drive, the connector being connected to a terminal pad in the FPC terminal portion. The FPC terminal portion is provided with a through hole for passing therethrough of a guide pin, while the connector is provided with a stepped through hole for passing therethrough of the guide pin, whereby the guide pin formed on the terminal fixing portion may be utilized in positioning the FPC terminal portion and the connector.

If an outer surface of the connector includes surfaces opposed in parallel to the inner surfaces of the first and second edge portions, these opposed surfaces may be approximated as close as possible to or contacted with the inner surfaces of the first and second edge portions. As a result, a predetermined spacing may be ensured between the FPC fixing portion and the FPC draw-out port side without reducing the size in the longitudinal direction which determines the pitch of the connector pin and the size in the transverse direction which determines the length of the connector pin.

According to the present invention it is possible to provide an FPC-connector connecting structure capable of effecting positioning easily and accurately relative to a base in a magnetic disk drive. Moreover, it is possible to provide an FPC-connector connecting structure capable of being adopted in case of using side faces of a base in a magnetic disk drive as sealing tape affixing faces. Further, it is possible to provide a highly reliable FPC-connector connecting structure in a magnetic disk drive. It is also possible to provide a magnetic disk drive adopting such a connecting structure.

DETAILED DESCRIPTION OF THE INVENTION

Figure 1:
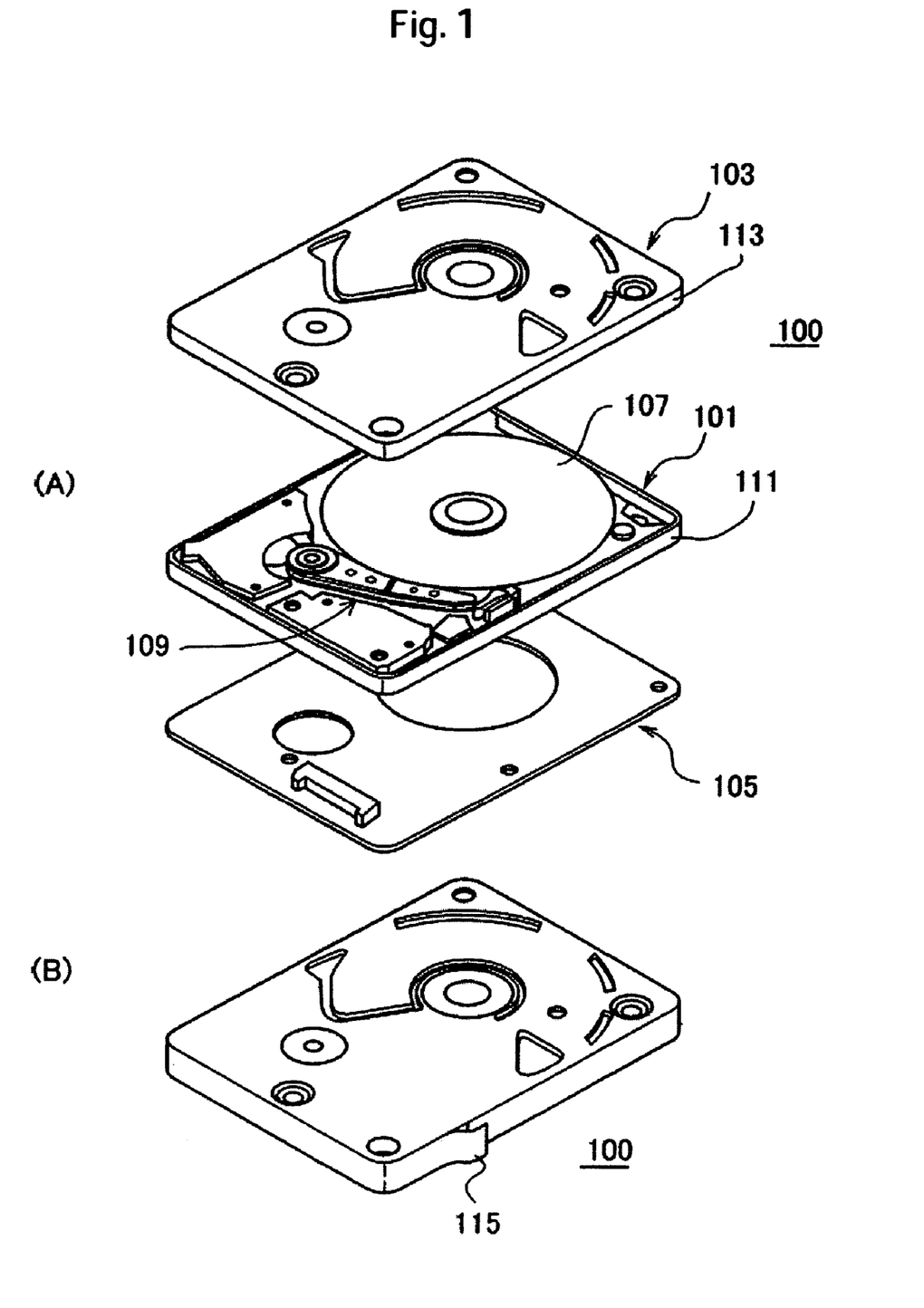
FIGS. 1A and 1B are assembly diagrams of a magnetic disk drive.

FIG. 1(A) is an exploded perspective view of a magnetic disk drive 100 according to an embodiment of the present invention. FIG. 1(B) shows in what state a base 101 and a base cover 103 are sealed together with a sealing tape 115 after assembly of the magnetic disk drive 100. The base 101 is formed by pressing a steel plate such as a stainless steel plate. A magnetic disk 107 and a head stack assembly 109 are mounted inside the base 101. The head stack assembly 109 carries heads which are adapted to access the magnetic disk 107. The base cover 103 combines with the base 101 to provide a clean air atmosphere in the inside thereof. Constituent elements of the magnetic disk drive are mounted on the base 101 and then covered with the base cover 103. The thus assembled mode of the magnetic disk drive is designated a head disk assembly (hereinafter referred to as "HDA").

In HDA according to this embodiment, the base 101 and the base cover 103 are formed in the shape of a box so that an outer surface 111 of a base edge and an outer surface 113 of a base cover edge serve as surfaces for affixing thereof a sealing tape 115. A circuit board 105 is mounted on the exterior of the HDA. The circuit board 105 includes a semiconductor element for controlling the operation of the magnetic disk drive 100 and for controlling communication with a host computer, and also includes a connector for connection with the HDA and the host computer.

Figure 2:
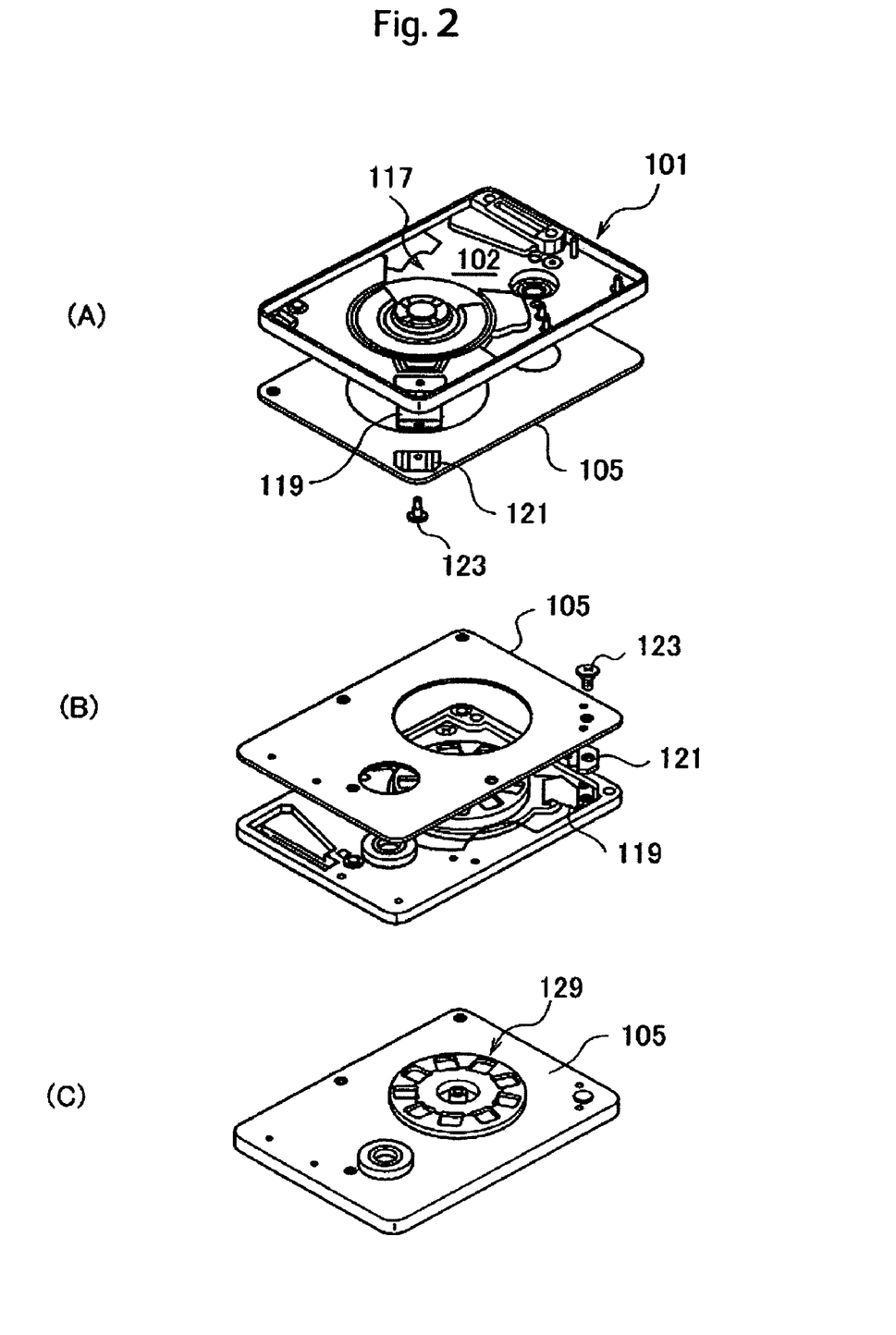
FIGS. 2A-2C are assembly diagrams of principal portions of the magnetic disk drive.
Figure 3:
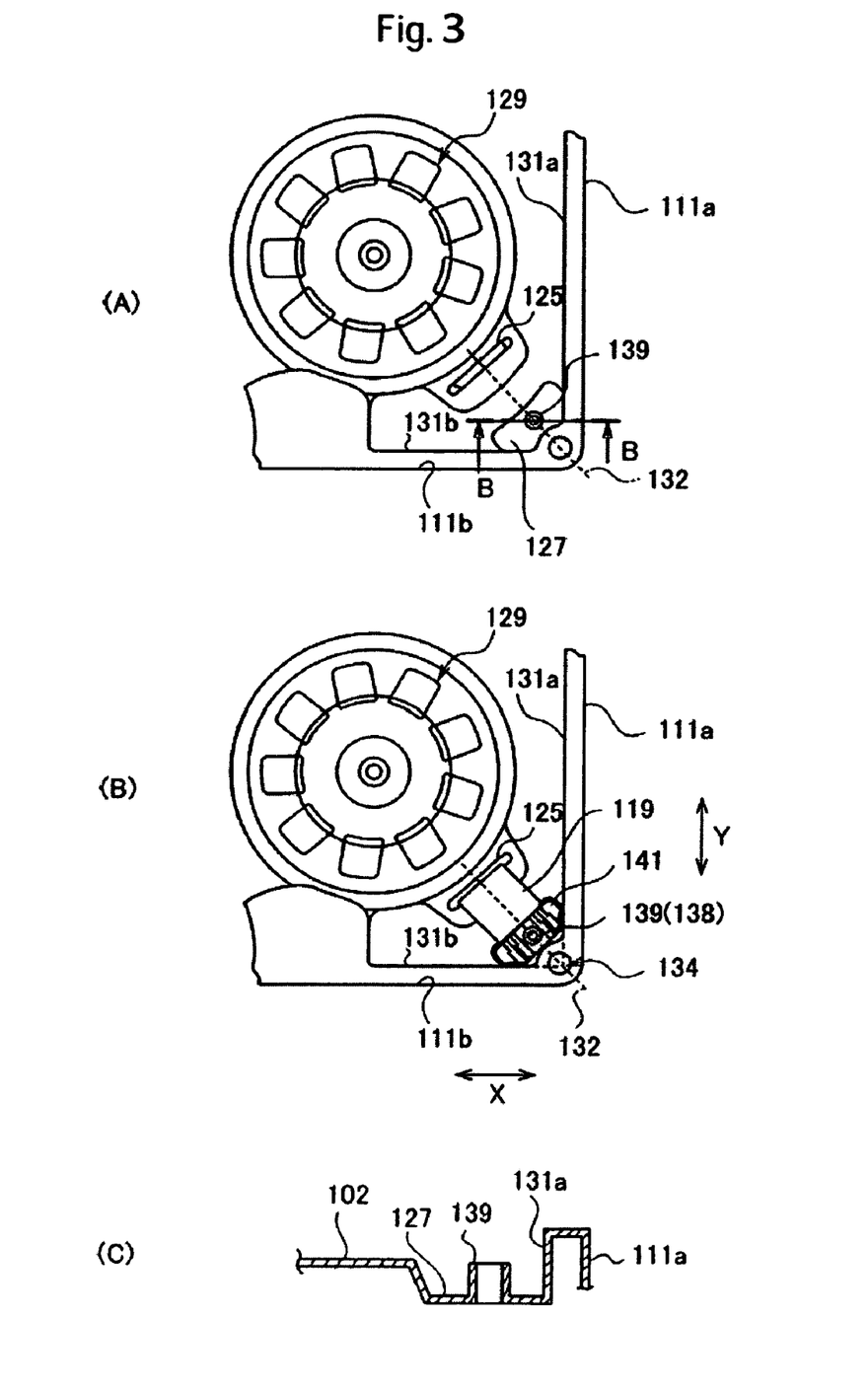
FIGS. 3A-3C are plan views of an FPC side of an FPC connecting structure according to an embodiment of the present invention.

FIG. 2(A) is a perspective view of the base 101 as seen from the base cover 103 side, showing a state in which only a spindle motor 117 and an FPC 119 connected to eight stator coils 129 of the spindle motor are mounted on the base. FIG. 2(B) is a perspective view of the base 101 as seen from the circuit board 105 side. FIG. 3 is a plan view of the FPC side in a connector-FPC connecting structure according to this embodiment. In FIG. 2(A) there is shown a state in which, when the circuit board 105 is fixed to the base 101 with a screw 123, the FPC 119 connected to the stator coils 129 (see FIG. 3) of the spindle motor 117 is connected to a connector 121. In FIG. 2(A), an extreme end of the FPC 119 is in a floating state from the bottom of the base 101, but just before mounting the circuit board 105 to the HDA, the extreme end of the FPC 119 is temporarily fixed to a terminal fixing portion 127 (see FIG. 3) formed on the bottom of the base, as shown in FIG. 2(B).

The FPC 119 is drawn out to the outside of the HDA from an FPC draw-out port 125 (see FIG. 3) formed in the bottom indicated at 102 of the base 101. An FPC terminal portion 141 (see FIG. 3) is formed at the extreme end of the FPC 119. The circuit board 105 with the connector 121 attached thereto is mounted to the HDA in a state in which the FPC terminal portion 141 is fixed to the terminal fixing portion 127 temporarily with a double-coated adhesive tape. A gap between the FPC draw-out port 125 and the FPC 119 is sealed with a sealing material after the FPC 119 is temporarily fixed to the terminal fixing portion 127. One manufacturing step for the magnetic disk drive 100 is completed in this state. Mounting of the circuit board 105 for the base 101 is performed in another step.

The method of fixing the FPC terminal portion 141 to the terminal fixing portion 127 of the base 101 with a double-coated adhesive tape is advantageous over the method of using a mere adhesive because it is simple and permits easy positional correction. However, a limit is encountered in the adhesive force of the double-coated adhesive tape. Therefore, during the period until the circuit board 105 is mounted and fixed permanently, it is desirable to prevent an extra force from being exerted on the FPC terminal portion 141 due to deflection or the like of the FPC 119 which would cause a positional error. As will be explained below with reference to FIGS. 3 and 4, the FPC 119—connector 121 connecting structure according to this embodiment solves the conventional problems related to positioning accuracy and positional deviation.

The FPC draw-out port 125 as an elongated opening and the terminal fixing portion 127 both formed in the bottom 102 of the base 101 are shown in FIG. 3(A). In FIG. 3(B) there is shown a state in which the FPC 119 has been drawn out from the FPC draw-out port 125 and the FPC terminal portion 141 has been fixed temporarily to the terminal fixing portion 127. FIG. 3(C) is a sectional view as seen in the direction of arrow B-B in FIG. 3(A). In FIG. 3, the reference numerals 111a and 111b denote outer surfaces of base edges. The bottom 102 of the base is not a flat surface as a whole, but is depressed and projected for mounting constituent elements of the magnetic disk drive 100 such as the spindle motor 117 and a pivot cartridge. The base bottom 102 indicates the whole region exclusive of edge portions of the base.

A guide pin 139 is formed centrally of the terminal fixing portion 127 by burring the bottom 102 of the base 101. The inside of the guide pin 139 is tapped to permit tightening of a screw which is for fixing the circuit board to the base 101. The guide pin 139 projects to the surface side on which the FPC terminal portion 141 of the terminal fixing portion 127 is rested so that the guide pin may be utilized for positioning the FPC terminal portion 141 in X and Y directions relative to the base 101. More specifically, as shown in FIG. 3(B), a through hole 138 matching the profile of the guide pin 139 is formed centrally of the FPC terminal portion 141 and the FPC terminal portion 141 is disposed so that the guide pin 139 passes through the through hole 138 in the terminal fixing portion 127. Thus, positioning of the FPC terminal portion 141 in X and Y directions may be done accurately.

The terminal fixing portion 127 is provided at a corner of the base 101. The FPC draw-out port 125 is formed in such a manner that a center line 132 passing perpendicularly through a middle point of a longitudinal edge passes through a corner 134 which is defined by surfaces including inner surfaces 131a and 131b of bases edges. Alternatively, the FPC draw-out port 125 and the terminal fixing portion 127 are positioned in place so that the FPC terminal portion 141 is fixed to the terminal fixing portion 127 at a position at which the FPC 119 drawn out along the edge of the draw-out port 125 extends straight in the longitudinal direction. Therefore, when the FPC terminal portion 141 is fixed temporarily to the terminal fixing portion 127 with a double-coated adhesive tape, there is scarcely any deflection in an intermediate position of the FPC 119. As a result, unlike the conventional connecting structure, there is no fear of occurrence of a positional deviation of the FPC terminal portion 141 during the period until the circuit board 105 is mounted and the FPC terminal portion 141 is fixed permanently. As shown in FIG. 3(C), the terminal fixing portion 127 is formed in a depressed shaped in the bottom of the base. The reason is that the connector is to be received in the depressed position to prevent an increase of thickness when the base 101 and the circuit board 105 are assembled.

Figure 4:
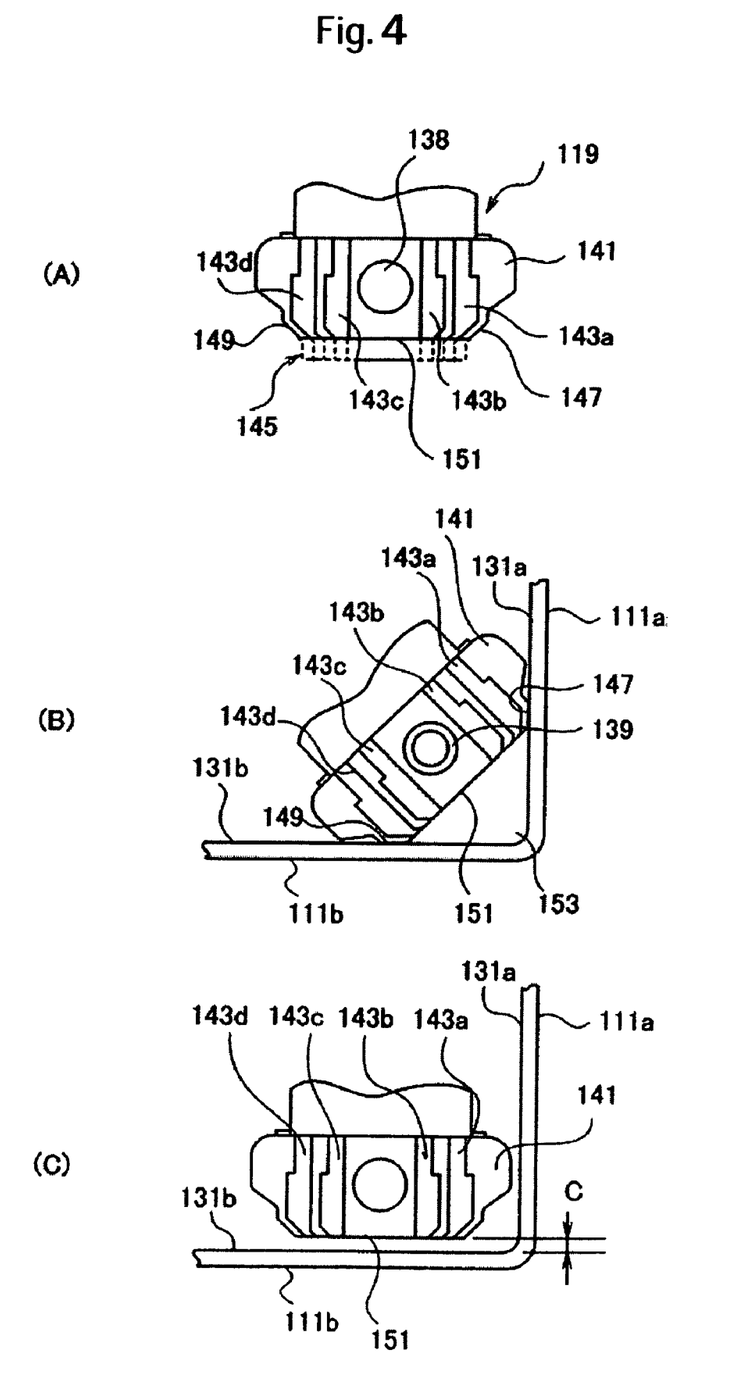
FIGS. 4A-4C showing the details of an FPC terminal portion.

FIG. 4 shows the details of the FPC terminal portion 141. The FPC 119 is of a structure wherein four conductor layers are sandwiched in between upper and lower insulating layers. At the extreme end of the FPC 119, the upper insulating layer is removed, allowing the top conductor layer to be exposed. The FPC terminal portion 141 is formed in a state in which terminal pads 143a, 143b, 143c and 143d are formed. The FPC terminal portion 141 is formed with mating portions 147 and 149 as rectilinear portions of the bottom insulating layer. The mating portions 147 and 149 are formed in such a manner that an angle defined by extension lines of both mating portions 147 and 149 is equal to an angle defined by crossing of surfaces which include the inner surfaces 131a and 131b of base edges. In this embodiment the angle is 90 degrees.

The terminal pads 143a, 143b, 143c and 143d are plated with gold. To plate with gold, the FPC terminal portion 141 is originally formed in an expanded shape up to a portion 145 indicated by a dotted line and the conductor layer in the expanded portion is used as a lead wire for connection with a gold plating electrode during plating with gold. Thereafter, the expanded portion 145 is cut at an extreme end 151 of the FPC terminal portion. Consequently, the conductor layers are exposed at the extreme end 151 of the FPC terminal portion. In the conventional connecting structure, the extreme end 151 of the FPC terminal portion is subjected to an insulating treatment because it is exposed to the exterior of the base 101, but such an insulating treatment is not needed in the connecting structure of this embodiment. The reason therefor will be stated later with reference to FIG. 4(B).

In FIG. 4(B), the mating portion 147 of the FPC terminal portion 141 matches the inner surface 131a of one base edge, while the mating portion 149 matches the inner surface 131b of the other base edge. Therefore, the FPC terminal portion 141 is defined in position in its rotational direction by the mating portions 147, 149 and the inner surfaces 131a, 131b of bases edges. In this connecting structure, positions in X and Y directions of the FPC terminal portion 141 are defined by the guide pin 139 and the position thereof in its rotational direction is defined by the inner surfaces 131a and 131b of base edges, so that the positioning accuracy is improved in comparison with the conventional FPC terminal structure which is subjected to visual positioning.

A method may be adopted wherein, when the FPC terminal portion 141 is positioned by the mating portions 147, 149 and the inner surfaces 131a, 131b of base edges, the FPC terminal portion 141 is fixedly secured with an adhesive while a force is applied toward the inner surfaces 131a and 131b. According to this method, not only the position in the rotational direction but also the position in X-Y directions may be defined even without the guide pin 139. As is seen from FIG. 4(B), a space 153 is defined between the extreme end 151 of the FPC terminal portion 141 and the inner surfaces 131a, 131b of base edges. Therefore, the extreme end 151 of the FPC terminal portion 141 does not contact the inner surfaces 131a, 131b of base edges, thus requiring no special insulating treatment.

In the base 101 used in this embodiment, if the FPC terminal portion 141 is to be disposed in such a manner that the extreme end 151 of the FPC terminal portion is parallel to the inner surface 131b of a base edge as shown in FIG. 4(C), it is necessary to provide a spacing indicated by size C in order to avoid electric short-circuiting between the extreme end 151 of the FPC terminal portion and the inner surface 131b. When there is no dimensional margin of the base on the FPC draw-out port 125 side, it is necessary to reduce the size of the FPC terminal portion 141 and thereby shorten the terminal pads 143a to 143d. Shortening the terminal pads 143a to 143d is not desirable because it may cause a defective contact between the terminal pads 143a to 143d and connector pins (see FIG. 5) of the connector. If the FPC terminal portion is disposed in its position shown in FIG. 4(C), positioning in the temporary fixing operation becomes difficult because there is no guide for physically positioning the FPC terminal portion 141.

Figure 5:
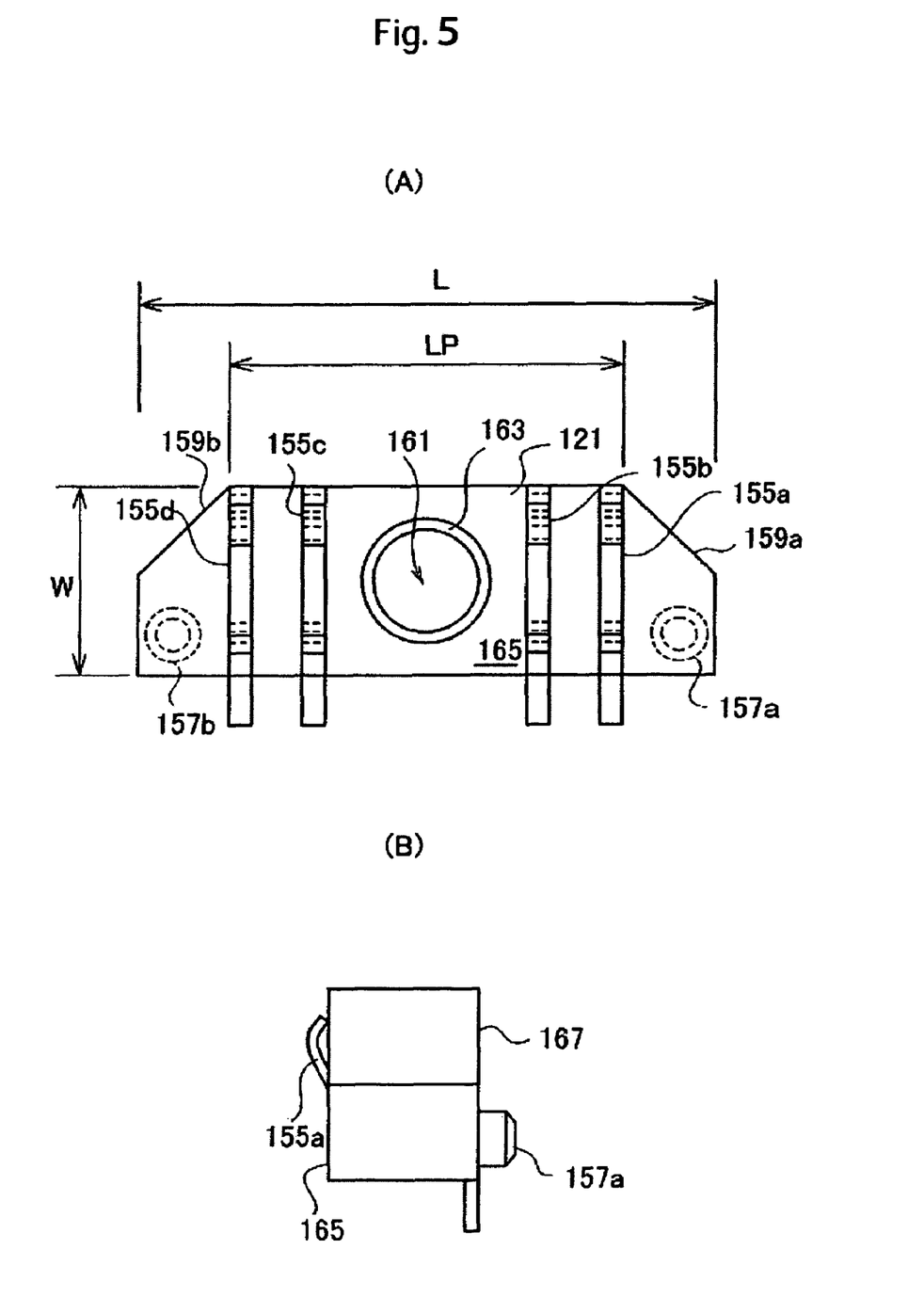
FIGS. 5A-5B are profile diagrams of a connector connected to the terminal portion.

FIG. 5 is a contour diagram of the connector 121 connected to the FPC terminal portion 141, in which FIG. 5(A) is a plan view and FIG. 5(B) is a side view. The connector 121 is attached to the circuit board 105 and is connected to a driver circuit of the spindle motor. Referring to FIG. 5(A), the connector 121 is formed with connector pins 155a, 155b, 155c and 155d. When the connector 121 and the FPC terminal portion 141 are connected together, the connector pins 155a to 155d are electrically connected to the terminal pads 143a to 143d, respectively. As shown in FIG. 5(B), the connector pins 155a to 155d are formed so as to be deformed elastically and are partially projected from a surface 165 of the connector.

The connector 121, when pushed toward the FPC terminal portion 141, is pushed by the terminal pads 143a to 143d and is deformed elastically.

A stepped through hole 161 including a stepped portion 163 is formed centrally of the connector 121. In a portion ranging from the surface 165 of the connector to the stepped portion 163, the stepped through hole 161 is formed large in inside diameter to match the guide pin 139. To the contrary, in a portion ranging from the stepped portion 163 to a back side 167 the stepped through hole 161 has an inside diameter suitable for passing therethrough of the screw 123. Positioning pins 157a and 157b for positioning relative to the circuit board 105 are formed on the back side 167 of the connector 121. The connector 121 is cut off at corners thereof to form oblique end 159a and 159b. The oblique ends 159a and 159b are formed so as to approach the inner surfaces 131a and 131b of base edges as close as possible or contact those inner surfaces. The connector 121 has such a profile shape as a connector shape of a rectangular parallelepiped having a length L and a width W without part of corners which the prior art had. However, the size LP between the outside connector pins 155a and 155d is ensured equal to that in the conventional connector.

Figure 6:
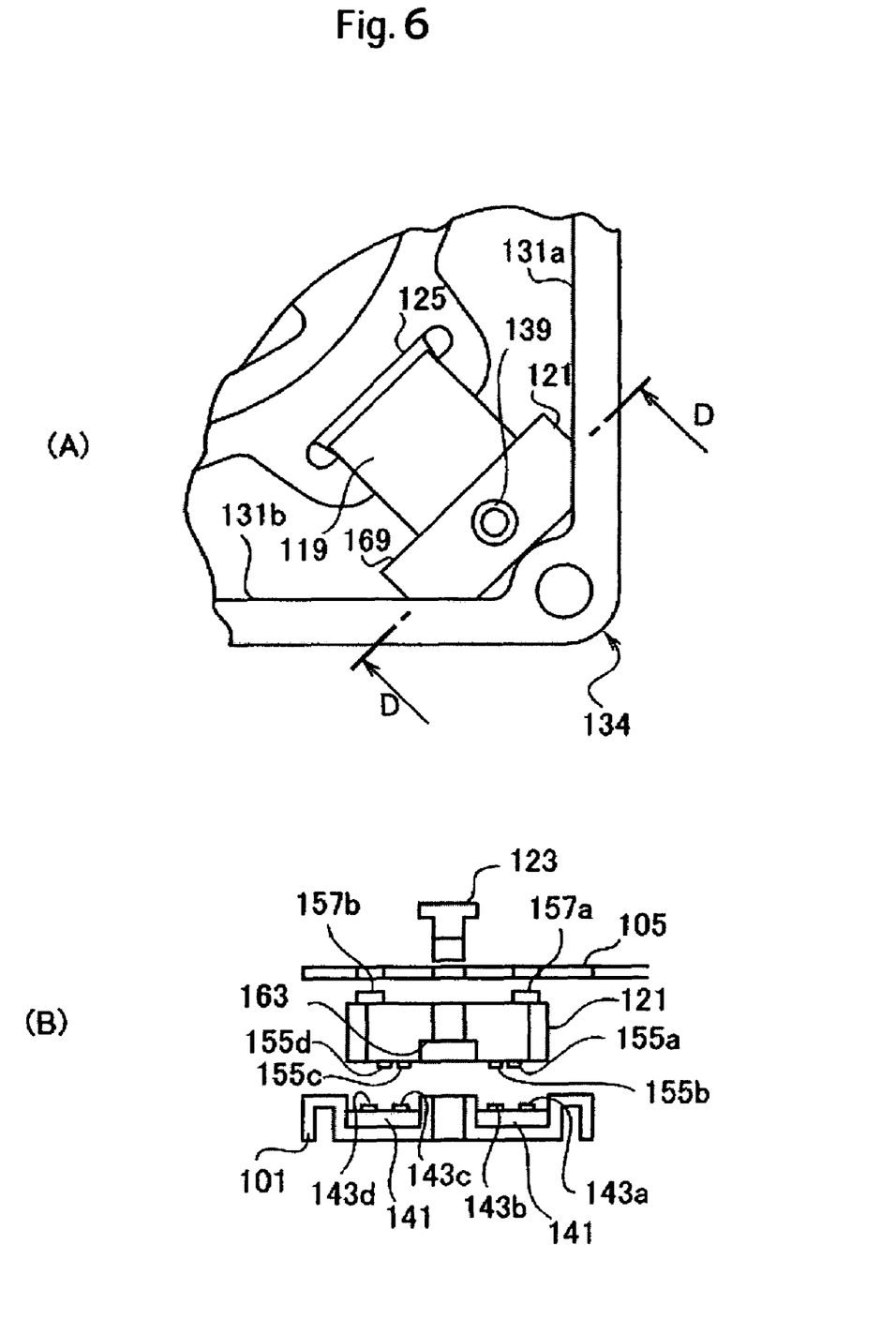
FIGS. 6A-6B are diagrams showing in what state the connector is connected to the terminal portion.

FIG. 6 shows in what state the connector 121 is connected to the FPC terminal portion 141. FIG. 6(A) shows a state in which the connector 121 alone is connected to the FPC terminal portion 141. FIG. 6(B) is a sectional view as seen in the direction of arrow D-D in FIG. 6(A), showing an exploded state, including the circuit board 105. The FPC terminal portion 141 is positioned while being guided by the guide pin 139 and the inner surfaces 131a and 131b of base edges and is fixed temporarily to the terminal fixing portion 127 with a double-coated tape. The connector 121 is fixed temporarily to the circuit board 105 with use of positioning pins 157a and 157b. When the circuit board 105 is mounted to the base 101 while being positioned relative to the base 101, the connector pins 155a to 155d of the connector 121 are aligned with the terminal pads 143a to 143d, respectively. The connector 121 leaves a slight play when fixed temporarily to the circuit board 105. When the circuit board 105 is mounted to the base 101 with the screw 123, the stepped through hole 161, which extends up to the stepped portion 163, mates with the guide pin 139 within the range of the play, whereby the connector 21 is set in place accurately relative to the FPC terminal portion 141.

Figure 8:
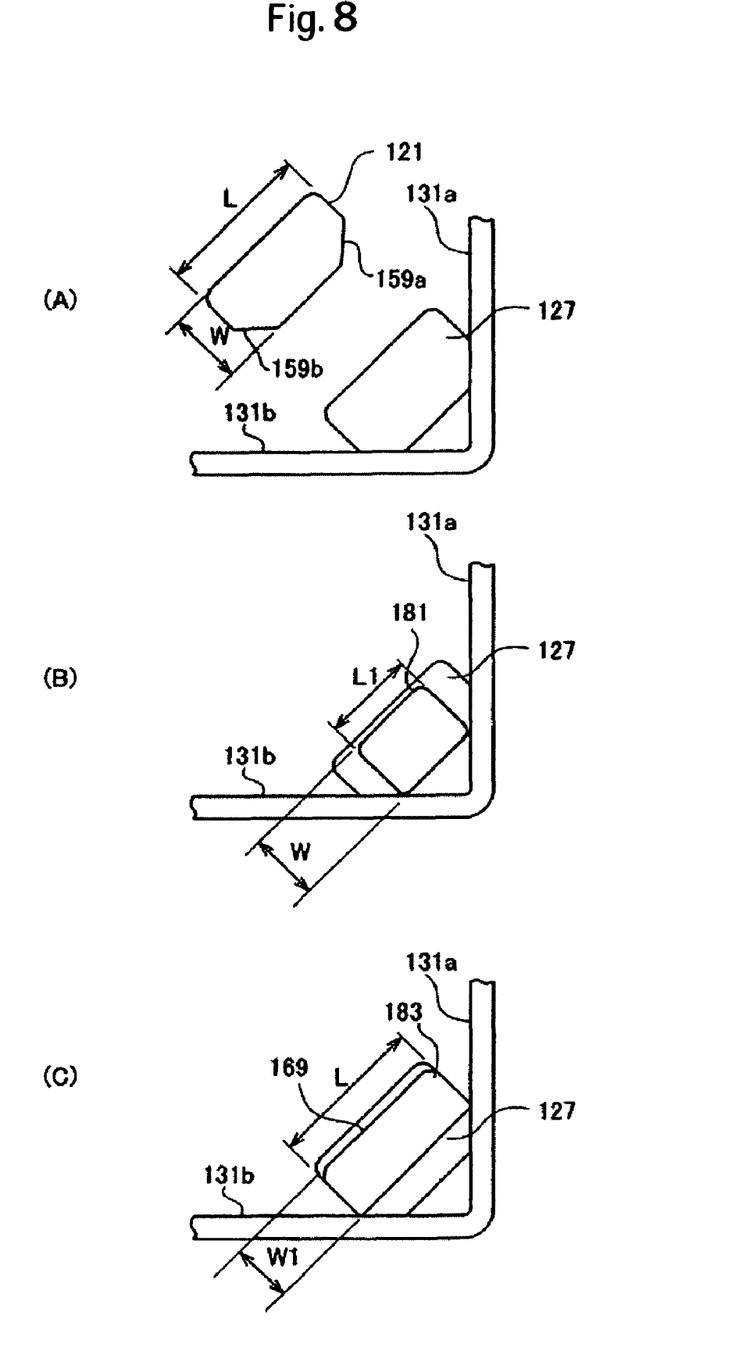
FIGS. 8A-8C are diagrams explaining morphological features of connectors.

FIG. 8 illustrates morphological features of connectors. The connector 121 has such a shape as shown in FIG. 8(A) in which corners of the conventional connector of a rectangular parallelepiped having a width W and a length L are cut off to provide the ends 159a and 159b. Therefore, the connector 121 may be disposed in the depressed terminal fixing portion 127 in a state in which the ends 159a and 159b are approximated as close as possible to the inner surfaces 131a and 131b of base edges or are put in contact with those inner surfaces. As shown in FIG. 8(A), the ends 159a and 159b are formed so that it is not necessary to shorten the spacing between the outside connector pins 155a and 155b. As shown in FIG. 8(B), when a connector 181 is fabricated in the shape of a rectangular parallelepiped as in the prior art and is to be received within the terminal fixing portion 127, it is impossible to accommodate the connector within the depressed terminal fixing portion 127 unless the connector length is reduced to L1 (L1<L).

When the connector length L is reduced, it is also necessary that the spacing between the outside connector pins 155a and 155d be made shorter smaller than in the conventional connector. Accordingly, it is also necessary to reduce the width and spacing with respect to the terminal pads 140a to 140d. As a result, the reliability of contact is deteriorated for a slight positional deviation between the connector pins 155a to 155d and the terminal pads 140a to 143d. If the connector length L is maintained equal to the conventional length, an end 169 of a connector 183 comes close to the FPC draw-out port 125 (see FIG. 6) as shown in FIG. 8(C) and therefore it is necessary that the depressed terminal fixing portion 127 be expanded up to the FPC draw-out port 125 side accordingly.

However, expanding the terminal fixing portion 127 is difficult because the bottom space of the base is limited and hence it is required to reduce the width of the connector 183 to W1 (W1<W). If the connector width is reduced, there arises the problem that the curvature of the bent portion where the connector pins 155a to 155d create elasticity becomes smaller and plastic deformation is apt to occur, with consequent deterioration of durability. According to the shape of the connector 121 according to this embodiment which is shown in FIG. 8(A), the connector length L which determines the pitch between the outside connector pins 155a and 155d and the connector width W which determines the length of each of the connector pins 155a to 155d may be ensured substantially similar to the conventional connector. Therefore, the reliability of contact and the durability of the connector pins may be maintained equal to those of the conventional connector.

It is to be understood that the above description is intended to be illustrative and not restrictive. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. A connecting structure for connection of a flexible printed circuit board (FPC) and a connector in a magnetic disk drive, comprising:
    a base having a bottom, a first edge portion rising from the bottom, and a second edge portion adjacent at a corner to the first edge portion and rising from the bottom; and
    an FPC terminal portion formed on the FPC and including a first mating portion and a second mating portion;
    wherein the FPC terminal portion is disposed in a terminal fixing portion on the exterior of the disk drive in a state in which the first mating portion is in contact with an inner surface of the first edge portion and the second mating portion is in contact with an inner surface of the second edge portion.

2. A connecting structure according to claim 1, wherein the FPC terminal portion is affixed to the terminal fixing portion with use of a double-coated adhesive tape.

3. A connecting structure according to claim 1, wherein the FPC terminal portion has a terminal pad plated with gold, the terminal pad being exposed at an extreme end thereof from an insulating material of the flexible printed circuit board.

4. A connecting structure according to claim 1, wherein an outer surface of the first edge portion and an outer surface of the second edge portion include sealing tape affixing surfaces.

5. A connecting structure according to claim 1, wherein the FPC is connected to a spindle motor of the magnetic disk drive.

6. A connecting structure for connection of a flexible printed circuit board (FPC) and a connector in a magnetic disk drive, comprising:
    a base having a bottom, a first edge portion rising from the bottom, and a second edge portion adjacent at a corner to the first edge portion and rising from the bottom; and
    an FPC terminal portion formed on the FPC and including a first mating portion and a second mating portion;
    wherein the FPC terminal portion is disposed in a terminal fixing portion in a state in which the first mating portion is in contact with an inner surface of the first edge portion and the second mating portion is in contact with an inner surface of the second edge portion, and
    wherein a guide pin is formed on the terminal fixing portion and the FPC terminal portion is provided with a through hole for passing therethrough of the guide pin.

7. A connecting structure according to claim 6, wherein the base is formed by pressing a steel plate, the guide pin is formed by burring, and the inside of the guide pin is tapped to conform to a screw which is for mounting the connector.

8. A connecting structure for connection of a flexible printed circuit board (FPC) and a connector in a magnetic disk drive, comprising:
    a base having a bottom, a first edge portion rising from the bottom, and a second edge portion adjacent at a corner to the first edge portion and rising from the bottom; and
    an FPC terminal portion formed on the FPC and including a first mating portion and a second mating portion;
    wherein the FPC terminal portion is disposed in a terminal fixing portion in a state in which the first mating portion is in contact with an inner surface of the first edge portion and the second mating portion is in contact with an inner surface of the second edge portion, and
    wherein a line perpendicular to a longitudinal edge of a draw-out port for the FPC and extending through a middle point of the longitudinal edge passes through the corner.

9. A magnetic disk drive comprising:
    a base having a bottom, a first edge portion rising from the base, and a second edge portion adjacent at a corner to the first edge portion and rising from the bottom;
    a base cover matching the base;
    a spindle motor mounted to the base; and
    a flexible printed circuit board (FPC) connected at one end thereof to the spindle motor and provided at an opposite end thereof with an FPC terminal portion, the FPC terminal portion including a first mating portion and a second mating portion and being disposed in a terminal fixing portion on the exterior of the disk drive in a state in which the first mating portion is in contact with an inner surface of the first edge portion and the second mating portion is in contact with an inner surface of the second edge portion.

10. A magnetic disk drive according to claim 9, further comprising a circuit board to which is mounted a connector connected to a terminal pad in the FPC terminal portion.

11. A magnetic disk drive according to claim 10, wherein the connector includes a positioning pin for the circuit board.

12. A magnetic disk drive according to claim 10, wherein an outer surface of the connector includes surfaces opposed in parallel to the inner surfaces of the first and second edge portions.

13. A magnetic disk drive according to claim 9, wherein a double-coated adhesive tape is disposed between the FPC terminal portion and the terminal fixing portion.

14. A magnetic disk drive according to claim 9, further comprising a sealing tape for sealing connections between the first and second edge portions and the base cover.

15. A magnetic disk drive according to claim 9, wherein the flexible printed circuit board is connected to the spindle motor.

16. A magnetic disk drive according to claim 9, wherein the base is formed by pressing a steel plate.

17. A magnetic disk drive according to claim 9, wherein the FPC terminal portion has a terminal pad plated with gold, the terminal pad being exposed at an extreme end thereof from an insulating material of the flexible printed circuit board.

18. A magnetic disk drive according to claim 9, wherein an outer surface of the first edge portion and an outer surface of the second edge portion include sealing tape affixing surfaces.

19. A magnetic disk drive comprising:
- a base having a bottom, a first edge portion rising from the base, and a second edge portion adjacent at a corner to the first edge portion and rising from the bottom;
- a base cover matching the base;
- a spindle motor mounted to the base;
- a flexible printed circuit board (FPC) connected at one end thereof to the spindle motor and provided at an opposite end thereof with an FPC terminal portion, the FPC terminal portion including a first mating portion and a second mating portion and being disposed in a terminal fixing portion in a state in which the first mating portion is in contact with an inner surface of the first edge portion and the second mating portion is in contact with an inner surface of the second edge portion; and
- a circuit board to which is mounted a connector connected to a terminal pad in the FPC terminal portion, wherein a guide pin is formed in the terminal fixing portion, the FPC terminal portion is provided with a through hole for passing therethrough of the guide pin, and the connector is provided with a stepped through hole for passing therethrough of the guide pin.

20. A magnetic disk drive comprising:
- a base having a bottom, a first edge portion rising from the base, and a second edge portion adjacent at a corner to the first edge portion and rising from the bottom;
- a base cover matching the base;
- a spindle motor mounted to the base; and
- a flexible printed circuit board (FPC) connected at one end thereof to the spindle motor and provided at an opposite end thereof with an FPC terminal portion, the FPC terminal portion including a first mating portion and a second mating portion and being disposed in a terminal fixing portion in a state in which the first mating portion is in contact with an inner surface of the first edge portion and the second mating portion is in contact with an inner surface of the second edge portion, wherein a line perpendicular to a longitudinal edge of a draw-out port for the FPC and extending through a middle point of the longitudinal edge passes through the corner.

* * * * *

UNITED STATES PATENT AND TRADEMARK OFFICE
CERTIFICATE OF CORRECTION

PATENT NO. : 7,545,598 B2  
APPLICATION NO. : 11/317808  
DATED : June 9, 2009  
INVENTOR(S) : Kitahori et al.

Page 1 of 1

It is certified that error appears in the above-identified patent and that said Letters Patent is hereby corrected as shown below:

In the Brief Description of the Drawings:

Column 4, line 46, please delete "4A-4C" and insert -- 4A-4C are diagrams --

Column 4, line 48, please delete "5A-5B" and insert -- 5A and 5B --

Column 4, line 50, please delete "6A-6B" and insert -- 6A and 6B --

Signed and Sealed this

First Day of September, 2009

David J. Kappos
*Director of the United States Patent and Trademark Office*